United States Patent
Page et al.

(10) Patent No.: US 9,733,429 B2
(45) Date of Patent: Aug. 15, 2017

(54) STACKED MICROLATTICE MATERIALS AND FABRICATION PROCESSES

(71) Applicant: HRL LABORATORIES, LLC, Malibu, CA (US)

(72) Inventors: David Page, Malibu, CA (US); Sophia S. Yang, Los Angeles, CA (US); Alan J. Jacobsen, Woodland Hills, CA (US); Zak C. Eckel, Calabasas, CA (US); Christopher S. Roper, Santa Monica, CA (US); William Carter, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 27 days.

(21) Appl. No.: 14/461,841

(22) Filed: Aug. 18, 2014

(65) Prior Publication Data

US 2016/0047980 A1 Feb. 18, 2016

(51) Int. Cl.
| | |
|---|---|
| *G02B 6/122* | (2006.01) |
| *G02B 6/138* | (2006.01) |
| *G02B 6/12* | (2006.01) |
| *B29K 96/00* | (2006.01) |
| *G02B 1/00* | (2006.01) |

(52) U.S. Cl.
CPC ......... *G02B 6/1225* (2013.01); *G02B 6/138* (2013.01); *B29K 2096/00* (2013.01); *G02B 1/002* (2013.01); *G02B 2006/12173* (2013.01)

(58) Field of Classification Search
None
See application file for complete search history.

(56) References Cited

U.S. PATENT DOCUMENTS

| | | | |
|---|---|---|---|
| 3,486,278 A | 12/1969 | Woods | |
| 4,575,330 A | 3/1986 | Hull | |
| 4,671,841 A | 6/1987 | Stephens | |
| 5,704,169 A | 1/1998 | Richter | |
| 6,631,231 B2 | 10/2003 | Mizuuchi et al. | |

(Continued)

OTHER PUBLICATIONS

Gauvin et al., "Microfabrication of complex porous tissue engineering scaffolds using 3D projection stereolithography," Biomaterials, 33:3824-3834, 2012.

(Continued)

*Primary Examiner* — Jerry Rahll
(74) *Attorney, Agent, or Firm* — Lewis Roca Rothgerber Christie LLP (57) ABSTRACT

A system and method for forming microlattice structures of large thickness. In one embodiment, a photomonomer resin is secured in a mold having a transparent bottom, the interior surface of which is coated with a mold-release agent. A substrate is placed in contact with the top surface of the photomonomer resin. The photomonomer resin is illuminated from below by one or more sources of collimated light, through a photomask, causing polymer waveguides to form, extending up to the substrate, forming a microlattice structure connected with the substrate. After a layer of microlattice structure has formed, the substrate is raised using a translation-rotation system, additional photomonomer resin is added to the mold, and the photomonomer resin is again illuminated through the photomask, to form an additional layer of microlattice structure. The process is repeated multiple times to form a stacked microlattice structure.

15 Claims, 7 Drawing Sheets

(56) References Cited

U.S. PATENT DOCUMENTS

| | | |
|---|---|---|
| 6,650,817 B2 | 11/2003 | Murali |
| 6,660,192 B1 | 12/2003 | Kim et al. |
| 6,684,007 B2 | 1/2004 | Yoshimura et al. |
| 6,862,393 B2 | 3/2005 | Nashimoto |
| 6,879,757 B1 | 4/2005 | Zhou et al. |
| 6,898,362 B2 | 5/2005 | Forbes et al. |
| 6,952,504 B2 | 10/2005 | Bi et al. |
| 6,993,235 B2 | 1/2006 | Takagi et al. |
| 7,006,747 B2 | 2/2006 | Escuti et al. |
| 7,020,374 B2 | 3/2006 | Talin et al. |
| 7,024,093 B2 | 4/2006 | Shelnut et al. |
| 7,088,432 B2 | 8/2006 | Zhang |
| 7,382,959 B1 | 6/2008 | Jacobsen |
| 7,653,276 B1 | 1/2010 | Gross et al. |
| 7,653,279 B1 | 1/2010 | Jacobsen |
| 7,687,132 B1 | 3/2010 | Gross et al. |
| 8,195,023 B1 | 6/2012 | Jacobsen et al. |
| 8,353,240 B1 | 1/2013 | Schaedler et al. |
| 8,573,289 B1 | 11/2013 | Roper et al. |
| 8,671,646 B2 | 3/2014 | Zhuo et al. |
| 8,745,958 B2 | 6/2014 | Kang et al. |
| 9,116,428 B1 | 8/2015 | Jacobsen et al. |
| 2004/0021237 A1 | 2/2004 | Shimizu et al. |
| 2004/0264863 A1 | 12/2004 | Suzuki et al. |
| 2005/0069637 A1 | 3/2005 | Bae et al. |
| 2005/0135745 A1 | 6/2005 | Greiner et al. |
| 2005/0287696 A1 | 12/2005 | Dumais et al. |
| 2006/0029348 A1 | 2/2006 | Kempen et al. |
| 2006/0172553 A1 | 8/2006 | Choi et al. |
| 2010/0159303 A1 | 6/2010 | Rock et al. |
| 2010/0291466 A1 | 11/2010 | Rock et al. |
| 2010/0300669 A1 | 12/2010 | Jacobsen et al. |
| 2012/0063131 A1 | 3/2012 | Jamar et al. |
| 2013/0198121 A1 | 8/2013 | Modha et al. |
| 2013/0273347 A1 | 10/2013 | Jacobsen et al. |
| 2013/0303067 A1 | 11/2013 | Doty et al. |
| 2014/0037873 A1 | 2/2014 | Cheung et al. |
| 2014/0251585 A1 | 9/2014 | Kusuda et al. |
| 2014/0272277 A1 | 9/2014 | Schaedler et al. |
| 2014/0288650 A1 | 9/2014 | Hunt |
| 2015/0176132 A1 | 6/2015 | Hundley et al. |

OTHER PUBLICATIONS

International Search Report and Written Opinion for International Application No. PCT/US2015/045531, mailed Nov. 25, 2015, 14 pages.

U.S. Office Action issued in U.S. Appl. No. 14/462,508, dated Mar. 3, 2016, 25 pages.

Bertsch et al., "Microstereolithography: a Review," Mat. Res. Soc. Symp. Proc., 758:3-15, 2003.

Chuang et al., "A New Method to Fabricate Polymer Waveguides," Progress in Electromagnetics Research Symposium, pp. 92-95, Aug. 22-26, 2005.

Jacobsen et al., "Compression behavior of micro-scale truss structures formed from self-propagating polymer waveguides," Acta Materialia, 55:6724-6733, 2007.

Kagami et al., "Light-induced self-written three-dimensional optical waveguide," Applied Physics Letters, 79 (8):1079-1081, Aug. 20, 2001.

Kewitsch et al., "Nonlinear optical properties of photoresists for projection lithography," Appl. Phys. Lett., 68 (4):455-457, Jan. 22, 1996.

Pan et al., "Rapid Manufacturing in Minutes: The Development of a Mask Projection Stereolithography Process for High-Speed Fabrication," ASME, pp. 1-10, Jun. 4-8, 2012.

Shoji et al., Optically-induced growth of fiber patterns into a photopolymerizable resin, Applied Physics Letters, Aug. 2, 1999, 737-739, vol. 75, No. 5, Department of Applied Physics, Osaka.

Sun et al., "Two-Photon Photopolymerization and 3D Lithographic Microfabrication," APS, 170:169-273, 2004.

Behler et al., "Techniques for Hierarchical Bio-Inspired Vascular Networks: Electrohydrodynamic Viscous Fingering and Electrical Treeing," Materials Engineering and Sciences Division, 11 AIChE, 3 pages, Oct. 19, 2011.

Evans et al., "Concepts for enhanced energy absorption using hollow micro-lattices," International Journal of Impact Engineering, pp. 1-13, 2010.

Jacobsen et al., "Micro-scale Truss Structures formed from Self-Propagating Photopolymer Waveguides**," Adv. Mater., 19:3892-3896, 2007.

Kithcart et al., "Heat Transfer and Skin Friction Comparison of Dimpled Versus Protrusion Roughness," Journal of Enhanced Heat Transfer, 3(4):273-280, 1996.

Murray, "The Physiological Principle of Minimum Work. I. The Vascular System and the Cost of Blood Volume," Physiology: C.D. Murray, vol. 12, pp. 207-214, 1926.

Thomas, "Multifunctional Poro-Vascular Composites for UAV Performance Enhancement," U.S. Naval Research Laboratory, 20 pages, Jul. 31, 2012.

U.S. Notice of Allowance for U.S. Appl. No. 14/462,501, dated Jun. 12, 2015, 5 pages.

U.S. Office Action issued in U.S. Appl. No. 14/462,501, dated Apr. 20, 2015, 8 pages.

U.S. Office Action issued in U.S. Appl. No. 14/462,501, dated Feb. 5, 2015, 10 pages.

U.S. Appl. No. 14/462,501, entitled Basal Plane Reinforced Microlattice, 50 pages.

U.S. Office Action issued in related U.S. Appl. No. 14/462,508, dated Sep. 9, 2016 (9 pages).

U.S. Office Action for related U.S. Appl. No. 14/462,508, dated Jan. 12, 2017 (10 pages).

STACKED MICROLATTICE MATERIALS AND FABRICATION PROCESSES

CROSS-REFERENCE TO RELATED APPLICATION(S)

The present application is related to U.S. Pat. No. 7,382,959 ("the '959 patent") and U.S. Pat. No. 7,938,989 ("the '989 patent"), the entire contents of both of which are incorporated herein by reference. The present application is also related to the following U.S. patent applications, filed on the same day as the present application: application Ser. No. 14/462,306 filed on Aug. 18, 2014, entitled "STRUCTURES HAVING SELECTIVELY METALLIZED REGIONS AND METHODS OF MANUFACTURING THE SAME", application Ser. No. 14/462,501 filed on Aug. 18, 2014, entitled "BASAL PLANE REINFORCED MICROLATTICE", application Ser. No. 14/462,508, filed on Aug. 18, 2014, entitled "HIERARCHICAL BRANCHED MICRO-TRUSS STRUCTURE AND METHODS OF MANUFACTURING THE SAME", and application Ser. No. 14/462,521, filed on Aug. 18, 2014, entitled "MULTI-CHEMISTRY MICROLATTICE STRUCTURES AND METHODS OF MANUFACTURING THE SAME"; the entire contents of these U.S. patent applications are also incorporated herein by reference.

FIELD

The following description relates to microlattice structures and more particularly to a system and method for fabricating microlattice structures with large dimensions.

BACKGROUND

Microlattice structures, such as those disclosed in the '989 patent, have numerous applications, for many of which a structure of a certain minimum size is needed. The fabrication method disclosed in the '989 patent involves forming microlattice structures by exposing a suitable liquid photomonomer to collimated light through one or more photomasks. Such a liquid photomonomer may undergo a refractive index change during a photo-polymerization process, which may lead to a formation of polymer optical waveguides. If a monomer that is photo-sensitive is exposed to light (typically UV) under the right conditions, the initial area of polymerization, such as a small circular area, will "trap" the light and guide it to the tip of the polymerized region, further advancing that polymerized region. This process will continue, leading to the formation of a waveguide structure with approximately, or about, the same cross-sectional dimensions along its entire length. A photomask with a two-dimensional pattern of apertures may be used (or utilized) to create a three-dimensional polymer microstructure, when a tray of photomonomer is illuminated from above, through the photomask, by collimated light from several different directions.

The thickness of the microlattice formed using (or utilizing) this fabrication approach is limited by the extent to which the collimated light is able to propagate through the waveguide with sufficiently little attenuation to continue polymerizing the monomer at the end of the waveguide. Thus, there is a need for a system and method of fabricating a microlattice structure not limited in thickness by the extent to which the collimated light is able to propagate through the waveguide.

SUMMARY

In one embodiment of a system and method for forming microlattice structures of large thickness, a photomonomer resin is secured in a mold having a transparent bottom, the interior surface of which is coated with a mold-release agent. A substrate is placed in contact with the top surface of the photomonomer resin. The photomonomer resin is illuminated from below by one or more sources of collimated light, through a photomask, causing polymer waveguides to form, extending up to the substrate, forming a microlattice structure connected with the substrate. After a layer of microlattice structure has formed, the substrate is raised using (or utilizing) a translation-rotation system, additional photomonomer resin is added to the mold, and the photomonomer resin is again illuminated through the photomask, to form an additional layer of microlattice structure. The process is repeated multiple times to form a stacked microlattice structure.

According to an embodiment of the present invention there is provided a system for forming a microlattice structure, the system including: a reservoir configured to hold a volume of liquid photo-monomer, a bottom of the reservoir including a window, the window being at least partially transparent and being configured to seal the bottom of the reservoir; a chuck configured to hold a substrate; a translation-rotation system configured to support the chuck in a region above the reservoir; and a first source of collimated light, configured to project a first beam of collimated light along a first direction through the window and into the interior of the reservoir.

In one embodiment, the window includes a photomask.

In one embodiment, the system includes a photomask holder configured to secure a photomask to the bottom of the reservoir.

In one embodiment, the system includes a photomask secured to the bottom of the reservoir.

In one embodiment, the system includes: a second source of collimated light, configured to project a second beam of collimated light along a second direction through the photomask and into the interior of the reservoir; and a third source of collimated light, configured to project a third beam of collimated light along a third direction through the photomask and into the interior of the reservoir, the first direction being different from the second direction, the second direction being different from the third direction, and the first direction being different from the third direction.

In one embodiment, the photomask holder includes an at least partially transparent sheet; the window and the at least partially transparent sheet are configured to sandwich the photomask.

In one embodiment, the system includes a clamp configured to clamp the window, the photomask, and the at least partially transparent sheet together.

In one embodiment, the system includes a translation measurement device configured to measure a position of the translation-rotation system.

In one embodiment, the window includes, as a major component, a material selected from the group consisting of glass, quartz, clear plastic, and combinations thereof.

In one embodiment, an upper surface of the window is treated to avoid adhesion to the window.

In one embodiment, the chuck includes a magnet configured to secure the substrate by magnetic force.

In one embodiment, the chuck includes a flat surface with an orifice, the chuck being configured to secure the substrate by vacuum.

In one embodiment, the system includes a photomask with a plurality of apertures.

In one embodiment, the photomask includes, as a major component, a material selected from the group consisting of clear plastic, glass, quartz, and combinations thereof.

According to an embodiment of the present invention, there is provided a method for forming a microlattice structure, the method including: transferring a first volume of photomonomer to the interior of a reservoir, the reservoir including a window; securing a substrate to a chuck; operating a translation-rotation system to position the substrate in contact with the photomonomer; projecting a first beam of collimated light along a first direction through a photomask and into the interior of the reservoir, in a manner for causing a first waveguide to form in the photomonomer; to extend to the substrate; and to adhere to a lower surface of the substrate; and operating the translation-rotation system to raise the substrate and the first waveguide.

In one embodiment, the method includes: projecting a second beam of collimated light along a second direction through the photomask and into the interior of the reservoir, wherein: the projecting of a first beam of collimated light along a first direction through the photomask and into the interior of the reservoir; the operating of the translation-rotation system to raise the substrate and the first waveguide; and the projecting of a second beam of collimated light along a second direction through the photomask and into the interior of the reservoir; are performed in a manner for causing a second waveguide: to form in the photomonomer; to extend to the substrate; and to adhere to a lower end of the first waveguide.

According to an embodiment of the present invention there is provided a microlattice structure, including: a plurality of first waveguide members defined by a plurality of first self-propagating polymer waveguides and extending along a first direction; a plurality of second waveguide members defined by a plurality of second self-propagating polymer waveguides and extending along a second direction; and a plurality of third waveguide members defined by a plurality of third self-propagating polymer waveguides and extending along a third direction; wherein the first, second, and third waveguide members interpenetrate each other at a plurality of nodes to form a continuous material; and wherein the overall dimensions of the microlattice structure exceed 2 inches in length, 2 inches in width, and 2 inches in height.

BRIEF DESCRIPTION OF THE DRAWINGS

These and other features and advantages of the present invention will be appreciated and understood with reference to the specification, claims and appended drawings wherein:

DETAILED DESCRIPTION

The detailed description set forth below in connection with the appended drawings is intended as a description of exemplary embodiments of stacked microlattice materials and fabrication processes provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
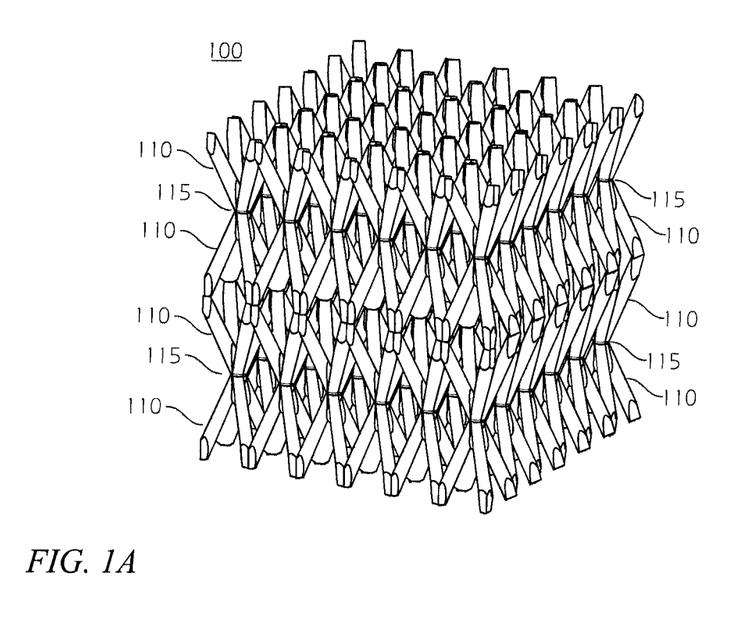
FIG. 1A is a perspective view of a stacked microlattice structure according to an embodiment of the present invention.
Figure 1B:
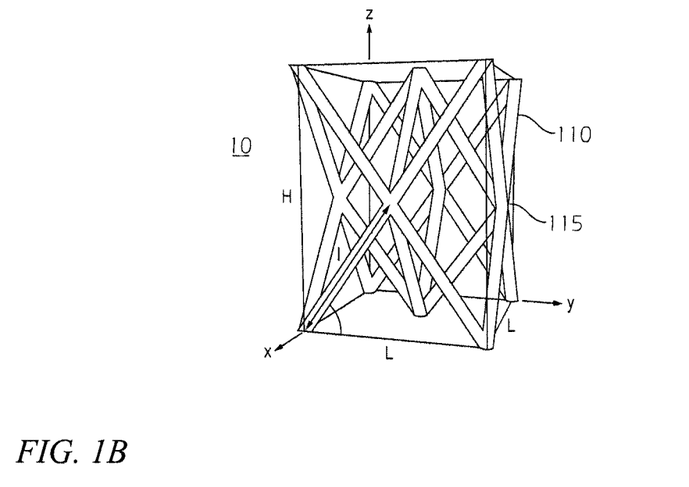
FIG. 1B is a perspective view of a unit cell of a stacked microlattice structure according to an embodiment of the present invention.

FIG. 1A and FIG. 1B show, respectively, a representative microlattice material 100 and a representative microlattice unit cell 10. In limited thicknesses (where thickness is used or utilized herein to refer to the direction that is vertical during fabrication, and corresponds to the Z-axis of FIG. 1B), such structures may be fabricated by a self-guided, or "self propagating" photo-polymerization process, as described in the '989 patent and in the '959 patent. Photopolymers undergo a refractive index change during the polymerization process, which can lead to the formation of polymer optical waveguides. If a photomonomer resin that is photo-sensitive is exposed to light (e.g., ultraviolet light) under the right conditions, the initial area of polymerization, such as a small circular area, will "trap" the light and guide it to the tip of the polymerized region, further advancing that polymerized region. This process will continue, leading to the formation of a waveguide structure with approximately or about the same cross-sectional dimensions along its entire length. The waveguides may interpenetrate at nodes 115, resulting in a structure including waveguide members 110 joined at the nodes 115. In one embodiment the nodes are not perturbed dimensionally by the change in index of refraction resulting from the photo-polymerization process, i.e., the nodes do not swell up, or have a local diameter exceeding the diameter of the waveguides 110 that meet at the nodes.

Figure 2A:
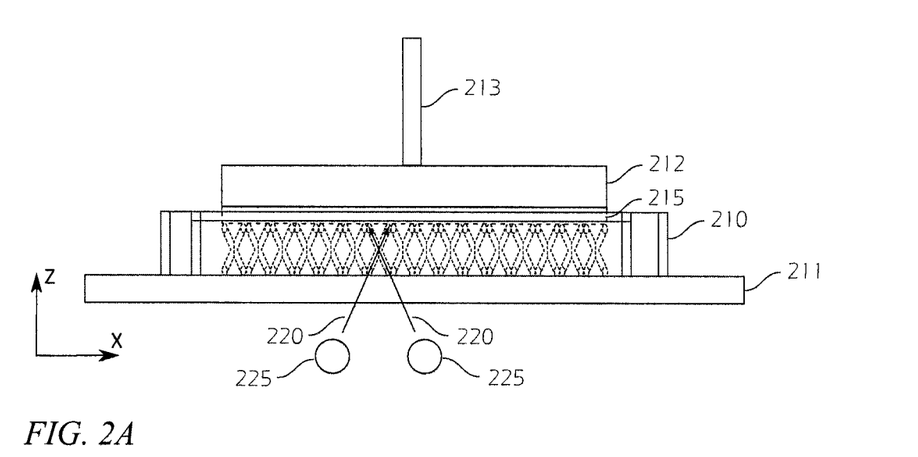
FIG. 2A is a side view of a system for fabricating a stacked microlattice structure, in a configuration for forming a first layer of a stacked microlattice structure, according to an embodiment of the present invention.
Figure 2B:
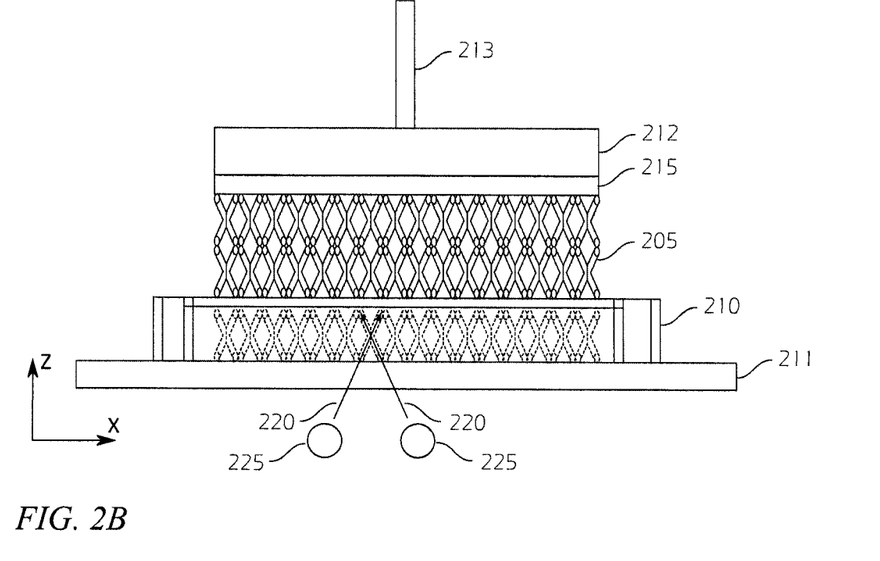
FIG. 2B is a side view of a system for fabricating a stacked microlattice structure, in a configuration for forming a third layer of a stacked microlattice structure, according to an embodiment of the present invention.
Figure 3:
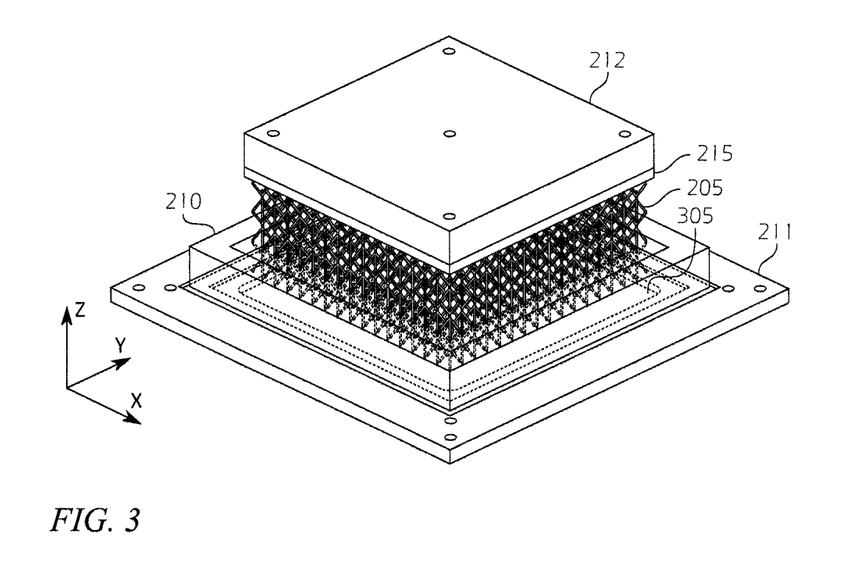
FIG. 3 is a perspective view of a system for fabricating a stacked microlattice structure according to an embodiment of the present invention.

Embodiments of the present invention utilize the process of forming such waveguides 110 in a parallel and sequential method to create large interconnected lattice materials. Layers of waveguide material are sequentially fabricated to form a thicker piece of material; the formation of each layer involves the parallel fabrication of multiple waveguides 110. Referring to FIG. 2A, in one embodiment, a system for fabricating a stacked microlattice structure 205 of significant thickness includes a photomonomer reservoir, or "mold" 210, having a bottom 211 with a window 305 (FIG. 3) that is at least partially transparent, and a chuck 212 configured to hold a substrate 215. The chuck 212 is movable as a result of being secured to a translation-rotation system 213, which is configured to move the chuck 212, in one or more degrees of freedom, in a controlled manner. The term "at least partially transparent" is used herein to mean (or refer to)

transparent or translucent, to at least one wavelength of light suitable for polymerizing the photomonomer resin. The system is configured so that a photomask 400 (FIG. 4) may be placed, e.g., underneath the window 305 of the mold 210, so that photomonomer resin may be poured into the mold 210, and the photomonomer resin may be illuminated, through the photomask 400, by beams 220 of collimated light from one or more sources 225 of collimated light that are placed below the bottom 211 of the mold 210. Referring to FIG. 2B, several layers of a partially formed stacked microlattice structure 205 may be held above, or protruding part-way into, the mold 210, while another layer is being formed in the mold 210. FIG. 3 shows a perspective view of the system illustrated in FIGS. 2A and 2B.

In one embodiment, the photomask 400 is disposed between the at least one collimated light source 225 and the mold 210. The photomask 400 extends along a single plane and has at least one hole, or "aperture" 402 (FIG. 4) adapted to guide a first beam, a second beam and a third beam of the collimated light beams into the photo-monomer to respectively form a first waveguide 110, a second waveguide 110 and a third waveguide 110 of the polymer waveguides 110 in a portion of the volume of the photo-monomer. The first beam is directed at a first angle with respect to the single plane, the second beam is directed at a second angle with respect to the single plane, the second angle being different from the first angle, and the third beam is directed at a third angle with respect to the single plane, the third angle being different from the first angle and the second angle. The first waveguide 110 forms a fourth angle with respect to the single plane, the fourth angle corresponding to the first angle, the second waveguide 110 forms a fifth angle with respect to the single plane, the fifth angle corresponding to the second angle, and the third waveguide 110 forms a sixth angle with respect to the single plane, the sixth angle corresponding to the third angle. The first waveguide 110, the second waveguide 110 and the third waveguide 110 intersect each other at the at least one aperture 402.

Figure 4:
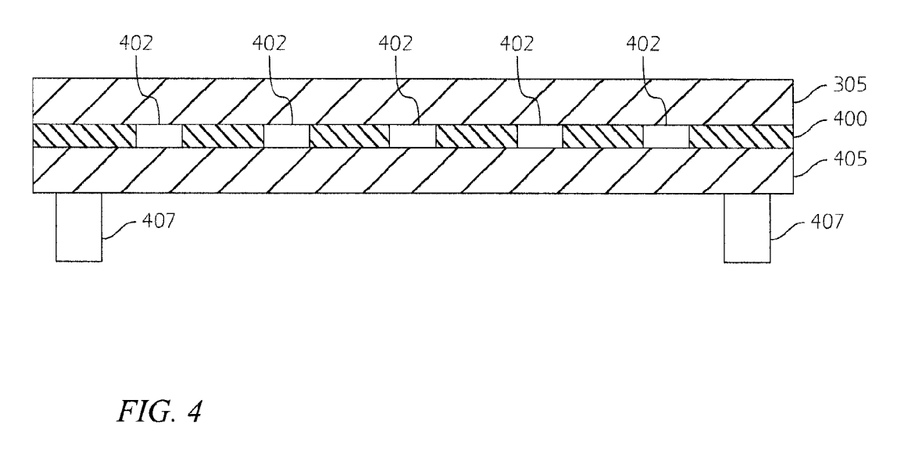
FIG. 4 is a cross sectional view of a photomask holder and a photomask, according to an embodiment of the present invention.

The photomask 400 is, in one embodiment, in the optical path between the one or more sources 225 of collimated light and the interior of the mold 210. The sizes, shapes, and locations of apertures 402 in the photomask 400 will determine the size, shapes, and locations of waveguides 110 formed when the photomonomer resin is subsequently exposed through the photomask 400. The photomask 400 may, for example, be a piece of glass, with a coating of an opaque material, such as a metal, patterned with suitable holes 402. The photomask 400 may be secured to the underside of the at least partially transparent portion of the bottom 211 of the mold 210, or it may be secured to the top side of the at least partially transparent portion of the bottom 211 of the mold 210, i.e., on the interior of the mold 210, or the photomask 400 may be integrated into, or form, the at least partially transparent portion of the bottom 211 of the mold 210, e.g., the bottom 211 of the mold 210 may be, or include, a patterned piece of glass. FIG. 4 illustrates a photomask 400 secured to the bottom of the window 305 by an at least partially transparent sheet 405. The photomask 400 is sandwiched between the at least partially transparent sheet 405 and the window 305. The at least partially transparent sheet 405 may be held in place, for example, by one or more clamps 407, which clamp the at least partially transparent sheet 405 to the window 305 or to the bottom 211 of the mold 210. The clamps 407 may for example be toggle clamps secured to the underside of the bottom 211 of the mold 210.

The mold 210 may be composed of two or more pieces, such as a rectangular frame forming the walls of the mold 210, and a substantially flat sheet forming the bottom 211 of the mold 210, which may be clamped together, or glued together with a suitable adhesive or sealant, or both clamped and glued. The rectangular frame may include wings on its exterior for clamping to the substantially flat sheet. The bottom 211 of the mold 210 may be composed of a substantially flat sheet of metal with a cutout to accommodate the window 305, and with a piece of glass installed in the cutout and sealed to the sheet of metal. The bottom 211 of the mold 210 may be coated, before use, with a mold release agent, such as SPRAYON™ MR314, to prevent the stacked microlattice structure 205 from adhering to the bottom 211 of the mold 210.

The horizontal extent of each layer of the stacked microlattice structure 205 may be defined by one or more factors, including the horizontal extent of the window 305 in the bottom 211 of the mold 210, the horizontal extent of the apertures in the photomask 400, and the locations of the walls of the mold 210. If the walls of the mold 210 are sufficiently close in to be illuminated by the collimated light, waveguides 110 may reach the walls of the mold 210, and the walls may, like the bottom 211 of the mold 210, be coated with a mold release agent to prevent the waveguides 110 from adhering to the walls.

Figure 5:
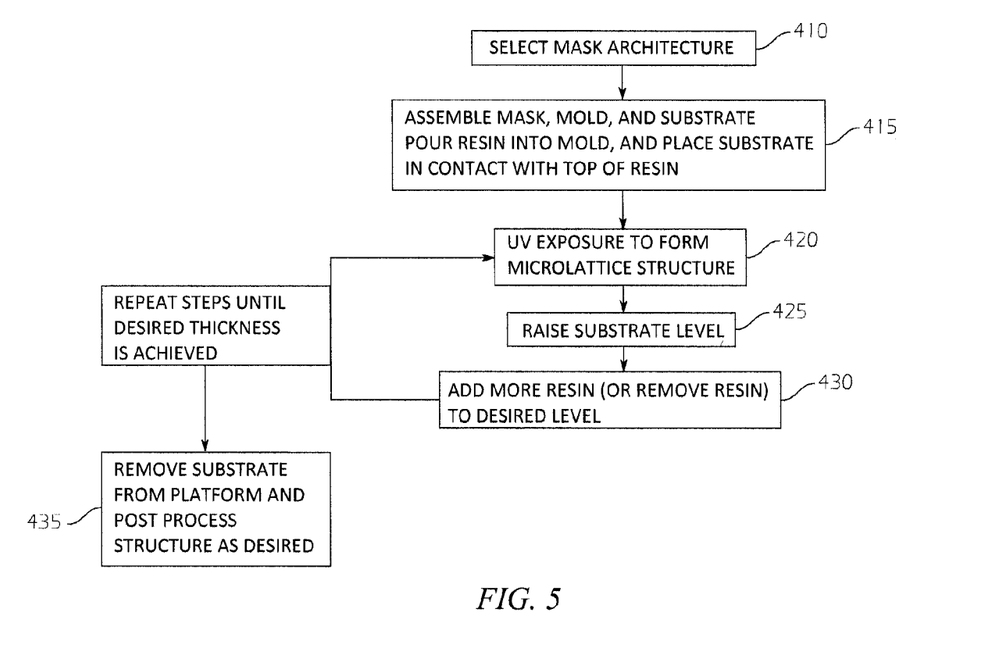
FIG. 5 is a flow chart illustrating a method for fabricating a stacked microlattice structure according to an embodiment of the present invention.

In operation, referring to FIG. 5, a microlattice structure 205 is fabricated in a sequence of acts, some of which may be repeated. In an act 410, a photomask architecture is selected. In an act 415, the photomask 400 and mold 210 are assembled, the substrate 215 is secured in the chuck 212, photomonomer resin is poured into the mold 210, and the substrate 215 is placed in contact with the top of the photomonomer resin. In an act 420, the photomonomer resin is exposed to collimated light, e.g., collimated ultraviolet (UV) light, through the photomask 400, causing waveguides 110 to form and producing a microlattice structure in the mold 210. The waveguides 110 propagate through the photomonomer resin to the substrate 215, and at the points where the waveguides 110 end at the substrate 215, they adhere to the substrate 215 and become connected with the substrate 215. In an act 425, the substrate 215 is raised, by raising the translation-rotation system 213 and the attached movable chuck 212, which holds the substrate 215. The microlattice structure, which is secured to the substrate 215 as a result of the adhesion of the waveguides 110 to the substrate 215, is raised out of the resin when the movable chuck 212 is raised. In an act 430, more photomonomer resin is then added to the mold 210, or, if a thinner layer is to be fabricated in the next exposure 420, photomonomer resin may be removed from the mold 210, to arrange for the top surface of the photomonomer resin to be in contact with the microlattice structure, or to have the bottom of the microlattice structure slightly submerged in the photomonomer resin. Acts 420, 425 and 430 may then be repeated, each time adding a layer of microlattice structure with a thickness as large as the approximate (or about the) depth of the photomonomer resin in the mold 210, and resulting in a stacked microlattice structure 205 having a layer for each time act 420 was executed. Thus, a stacked microlattice structure 205 having a thickness greater than the thickness readily achievable in a single layer, and also having a large length and width, may form a continuous material as a result of the application of this method, i.e., the structure is homogeneous, and there is no change in the composition of the waveguides 110 at the interface between layers; the waveguides 110 are homogeneous and continuous across the interface, as distinct from a structure that could otherwise be formed of multiple microlattice structures bonded together with adhesive. After the final execution of act 420, the substrate 215 may be removed from the chuck 212, and the stacked microlattice structure 205 may, in an act 435, be post-processed, as desired, e.g., by post-curing the structure 205 with heat.

In one embodiment, in acts 415 and 430, the photomonomer resin is poured, while the substrate 215 and any attached layers of microlattice structure 205 are raised out of the way, into the mold 210 to a height that is sufficiently small to allow photopolymer waveguides 110 to propagate through the depth of photomonomer resin to the top surface of the photomonomer resin or at least to the surface of the substrate 215, during the exposure, in act 420. In one embodiment, the depth of photomonomer resin is in the range of 0.1"-1.0". The substrate 215 is lowered until it, or the most recently formed layer of the stacked microlattice structure 205, makes complete contact with the resin, and then the UV light is turned on to form a layer of the stacked microlattice structure 205. In another embodiment, the substrate 215 is held at the desired height by the translation-rotation system 213, and the photomonomer resin is injected through a side port into the mold 210 so that the resin is in contact with the bottom 211 of the mold 210 and the substrate 215, or with the mold 210 and the most recently formed layer of the stacked microlattice structure 205. In one embodiment, after photomonomer resin is added to the mold, an interval of time is allowed to elapse before exposing the photomonomer resin, to allow any currents created by the addition of the photomonomer resin to subside.

In one embodiment, the chuck 212 is raised after each exposure 420, lifting the structure out of the resin in only the z-direction without rotating. After additional resin is added to the mold 210, the chuck 212 is lowered so that the bottom lattice members from the previous layer are in contact with the resin, then the next microlattice layer is formed by exposing the resin to UV light. Because of the contact between the polymer of the first layer and the resin of the second layer, this second layer of microlattice will be form a continuous extension of the first layer of microlattice. When the chuck 212 is raised once again, the second layer of microlattice will be lifted out of the bath as well. This process of raising the chuck 212, adding more resin, lowering for contact between polymer and resin, and UV curing can be repeated until the desired thickness is achieved.

In the first exposure, i.e., the first time act 420 is executed, the exposure may be adjusted so that the microlattice structure polymerizes up to the bottom of the substrate 215 and forms a strong bond with the substrate 215. In another embodiment, to ensure good adhesion without over-exposing, a first exposure may be executed with a space between the substrate 215 and top surface of the photomonomer resin, making it possible to visually inspect the top surface of the photomonomer resin. After an initial exposure for the microlattice structure to propagate to that free surface (the top surface of the photomonomer resin), the substrate 215 is lowered to make contact with the resin, and a final, shorter exposure polymerizes the photomonomer resin at the points of contact or points of near-contact between the microlattice structure and the substrate 215, causing adhesion of the microlattice structure to the substrate 215. Similarly, if one or more layers of the stacked microlattice structure 205 have already been formed, an exposure may be executed with a space between the most recently formed layer and top surface of the photomonomer resin, as illustrated in FIG. 2B, making it possible to visually inspect the free surface. After the initial exposure for the microlattice structure to propagate to that free surface (the top surface of the photomonomer resin), the substrate 215 is lowered to allow the lowest of the previously formed layers of the stacked microlattice structure 205 to make contact with the resin, and a final, shorter exposure bonds the microlattice structure to the lowest of the previously formed layers.

Several techniques may be used to cause the microlattice structure formed in the exposure to remain secured to the substrate 215, and to become detached from the mold 210, when the substrate 215 is raised after an exposure 420. A primer, such as MOMENTIVE™ SS4155 01 P Silicon primer, may be applied to the substrate 215 before putting the substrate 215 in contact with the photomonomer resin, to promote adhesion between the substrate 215 and the microlattice structure. Mold release may be used to reduce adhesion between the substrate 215 and the mold 210.

When the chuck 212 is raised in act 425, it is brought to a new position such that the waveguides 110 which will form in the subsequent exposure 420 will contact and adhere to the waveguides 110 formed during the previous exposure 420, and subsequent further raising of the substrate 215 lifts all previously formed layers of the stacked microlattice structure 205.

Various fixtures may be constructed to form a system for practicing embodiments of the present invention. Such fixtures may maintain x-y alignment between microlattice layers, precisely translate the substrate 215 in a vertical direction, temporarily fix the reservoir in place, not obstruct collimated light beams, and allow clearance for the reservoir to be removed. In one embodiment, the translation-rotation system 213 is a robotic arm.

The chuck 212 secures the substrate 215 to the translation-rotation system 213 during fabrication of the stacked microlattice structure 205, and the substrate 215 can be released from the chuck 212, to allow the stacked microlattice structure 205 to be subsequently removed from the fixture, along with the substrate 215. If desired, the stacked microlattice structure 205 can then be separated from the substrate 215 in a separate operation, e.g., using (or utilizing) a cutting or scraping process with a knife or a spatula. In one embodiment, the stacked microlattice structure 205 is first separated from the substrate 215 and then post-cured. To hold the substrate 215, the chuck 212 may use magnetism, electromagnets, pneumatics, vacuum, reversible adhesives, or physical constraints, such as clamps or fasteners. In one embodiment the substrate 215 is composed of steel and the chuck 212 includes a magnet for holding the substrate 215.

The collimated light may be provided by a suitable source, such as a mercury arc lamp, or ultraviolet (UV) light emitting diodes (LEDs) or lasers.

The bottom 211 of the mold 210, through which the photomonomer resin is illuminated, may include a window 305 composed of a suitable translucent or transparent material, without implying a limitation, such as soda lime glass. In one embodiment the entire bottom 211 of the mold may be transparent, i.e., the entire bottom 211 of the mold may be the window 305.

Numerous variations on the embodiments described above are possible. Different photomasks may be used (or utilized) for various layers of the stacked microlattice structure 205; this may be accomplished by changing the photomask 400 between repetitions of the act 420 of exposing the photomonomer resin to collimated light. The angle from which the collimated light illuminates the photomonomer resin (and therefore direction of light propagation) may be altered between different repetitions of the act 420 to direct the path of the polymer waveguides 110 into a particular shape. The act 420 of exposing the photomonomer resin to collimated light may include two steps: without changing the height of the substrate 215 or adding more resin, the photomask 400 may be changed, or the direction of light propagation altered, or both, to create different features in the same layer of the stacked microlattice structure 205, or to grow an isolated feature through the thickness of a layer which also contains the same, undisturbed microlattice structure as adjacent layers. Other materials or objects, such as wires, basal planes, face sheets, tapered sacrificial tubesheet scaffolds, un-patterned intermediate sheets (e.g. thin metal, or thin polymer), or patterned intermediate sheets, e.g. patterned metal sheets or meshes, including, e.g., chemically etched, laser machined, or mechanically machined metal sheets, or patterned polymer sheets or meshes, non-woven polymer materials, or fabrics, may also be incorporated into the stacked microlattice structure 205 at various stages of fabrication, e.g., by placing a sheet of material on or near the top surface of the photomonomer resin before initiation of a new exposure. The cross-sections of the polymer waveguides 110 may be made to vary between layers, by changing the photomask 400 between layers, and some or all of the layers may have polymer waveguides 110 that are tapered in diameter.

When the chuck 212 is raised in act 420, it need not be translated only in the vertical direction, but may also be translated in a horizontal direction, or rotated, or both, as long as a subset of nodes or structural features overlap between exposure steps. This approach may be used to produce arbitrarily shaped lattice structures.

Embodiments of the present invention may be used to fabricate heat exchangers or mass exchangers, which may be used in transmission oil coolers, evaporators, condensers, radiators, intercoolers, or ram-air heat exchangers for cabin cooling, to fabricate thick microlattice materials for use as thick energy absorbing materials (bumper beams, blast protection), acoustic dampening, cushions, or paddings (e.g., for mattresses or bedding), or to create a thick, open cellular scaffold, which may subsequently be converted to a different material.

Although exemplary embodiments of stacked microlattice materials and fabrication processes have been specifically described and illustrated herein, many modifications and variations will be apparent to those skilled in the art. Accordingly, it is to be understood that stacked microlattice materials and fabrication processes practiced according to principles of this invention may be embodied other than as specifically described herein. The invention is also defined in the following claims, and equivalents thereof.

What is claimed is:

1. A system for forming a microlattice structure, the system comprising: a reservoir configured to hold a volume of liquid photo-monomer, a bottom of the reservoir comprising a window, the window being at least partially transparent and being configured to seal the bottom of the reservoir; a chuck configured to hold a substrate; a translation-rotation system configured to support the chuck in a region above the reservoir; and a first source of collimated light, configured to project a first beam of collimated light along a first direction through the window and into the interior of the reservoir; and a photomask secured to the bottom of the reservoir.

2. The system of claim 1 wherein the photomask comprises a plurality of apertures.

3. The system of claim 2, wherein the photomask comprises, as a major component, a material selected from the group consisting of clear plastic, glass, quartz, and combinations thereof.

4. The system of claim 1, further comprising a photomask holder configured to secure the photomask to the bottom of the reservoir.

5. The system of claim 1, comprising: a second source of collimated light, configured to project a second beam of collimated light along a second direction through the photomask and into the interior of the reservoir; and a third source of collimated light, configured to project a third beam of collimated light along a third direction through the photomask and into the interior of the reservoir, the first direction being different from the second direction, the second direction being different from the third direction, and the first direction being different from the third direction.

6. The system of claim 5, wherein: the first source of collimated light is configured to form, with a first aperture of the photomask, a first waveguide, oblique to the photomask, in the volume of photo-monomer in the reservoir, the translation-rotation system is configured to translate the chuck upward a first distance; and the first source of collimated light is further configured to form, with a second aperture of the photomask, a second waveguide, oblique to the photomask, in the volume of photo-monomer in the reservoir, the second waveguide being collinear with the first waveguide translated upward by the first distance.

7. The system of claim 1, comprising a translation measurement device configured to measure a position of the translation-rotation system.

8. The system of claim 1, wherein the window comprises, as a major component, a material selected from the group consisting of glass, quartz, clear plastic, and combinations thereof.

9. The system of claim 1, wherein an upper surface of the window is treated to avoid adhesion to the window.

10. The system of claim 1, wherein the chuck comprises a magnet configured to secure the substrate by magnetic force.

11. The system of claim 1, wherein the chuck comprises a flat surface with an orifice, the chuck being configured to secure the substrate by vacuum.

12. The system of claim 1, further comprising an at least partially transparent sheet, wherein the window and the at least partially transparent sheet are configured to sandwich the photomask.

13. A microlattice structure, comprising: a plurality of first waveguide members defined by a plurality of first self-propagating polymer waveguides and extending along a first direction; a plurality of second waveguide members defined by a plurality of second self-propagating polymer waveguides and extending along a second direction; and a plurality of third waveguide members defined by a plurality of third self-propagating polymer waveguides and extending along a third direction; wherein the first, second, and third waveguide members interpenetrate each other at a plurality of nodes to form a continuous material; and wherein the overall dimensions of the continuous material exceed 2 inches in length, exceed 2 inches in width, and exceed, in height, a size exceeding an attenuation length of ultraviolet light in a photo-monomer that when polymerized by exposure to ultraviolet light forms a polymer of the first self-propagating polymer waveguides, the second self-propagating polymer waveguides, and the third self-propagating polymer waveguides.

14. A method for forming a microlattice structure, the method comprising: transferring a first volume of photo-monomer to an interior of a reservoir, the reservoir comprising a photomask secured to a bottom of the reservoir, the bottom of the reservoir comprising a window; securing a substrate to a chuck; operating a translation-rotation system to position the substrate in contact with the photo-monomer; projecting a first beam of collimated light along a first direction through the photomask and into the interior of the reservoir, in a manner for causing a first waveguide to form in the photo-monomer; to extend, in a direction oblique to the photomask, to the substrate; and to adhere to a lower surface of the substrate; and operating the translation-rotation system to raise the substrate and the first waveguide.

15. The method of claim 14, comprising: projecting a second beam of collimated light along a second direction through the photomask and into the interior of the reservoir, wherein: the projecting of a first beam of collimated light along a first direction through the photomask and into the interior of the reservoir; the operating of the translation-rotation system to raise the substrate and the first waveguide; and the projecting of a second beam of collimated light along a second direction through the photomask and into the interior of the reservoir; are performed in a manner for causing a second waveguide: to form in the photo-monomer; to extend, in a direction oblique to the photomask, to the substrate; and to adhere to a lower end of the first waveguide.

* * * * *